(12) United States Patent  
Potanin

(10) Patent No.: US 7,397,292 B1  
(45) Date of Patent: Jul. 8, 2008

(54) DIGITAL INPUT BUFFER WITH GLITCH SUPPRESSION

(75) Inventor: Vladislav Potanin, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 56 days.

(21) Appl. No.: 11/472,876

(22) Filed: Jun. 21, 2006

(51) Int. Cl.
*H03H 11/06* (2006.01)

(52) U.S. Cl. .................. 327/261; 327/268; 327/379; 327/552

(58) Field of Classification Search ......... 327/261–263, 327/268, 283, 290, 379, 551–553
See application file for complete search history.

(56) References Cited

U.S. PATENT DOCUMENTS

| | | | | |
|---|---|---|---|---|
| 3,805,178 A | * | 4/1974 | Rollett | 330/107 |
| 5,341,033 A | * | 8/1994 | Koker | 327/206 |
| 5,479,132 A | * | 12/1995 | Verhaeghe et al. | 327/553 |
| 5,689,200 A | * | 11/1997 | Ting et al. | 327/78 |
| 6,134,252 A | * | 10/2000 | Aspacio et al. | 372/34 |
| 6,392,474 B1 | * | 5/2002 | Li et al. | 327/551 |
| 6,704,416 B1 | * | 3/2004 | Sciabica, Jr. | 379/424 |
| 6,778,111 B1 | | 8/2004 | Zhu et al. | 341/134 |
| 6,958,641 B2 | | 10/2005 | Lee | 327/261 |
| 7,224,212 B2 | * | 5/2007 | Tseng | 327/551 |

* cited by examiner

*Primary Examiner*—N. Drew Richards
*Assistant Examiner*—Hai L. Nguyen
(74) *Attorney, Agent, or Firm*—Merchant & Gould PC

(57) ABSTRACT

A delay and deglitching circuit suppresses glitches occurring in a received digital signal while introducing a predetermined delay to the signal. The deglitching circuit comprises an RC filter and a Schmitt trigger. A node at the input of the Schmitt trigger fed by the RC filter is pulled to a high supply voltage or a low supply voltage when a glitch is removed or the input signal transitions. By setting the RC filter to initial conditions, multiple glitches can be removed with the same affectivity while reducing a sensitivity of the introduced delay to supply voltage variations.

16 Claims, 5 Drawing Sheets

*DEVICE WITH DEGLITCHING CIRCUIT*

CONVENTIONAL DEGLITCH & DELAY CIRCUIT

DEGLITCH & DELAY CIRCUIT

DEGLITCH &
DELAY CIRCUIT

FIG. 4  WAVEFORMS

DIGITAL INPUT BUFFER WITH GLITCH SUPPRESSION

FIELD OF INVENTION

The present invention relates to digital signal processing, and, in particular, to a digital input buffer circuit configured to provide a delay and glitch suppression to a received digital signal.

BACKGROUND

A glitch is an electrical pulse of short duration that is usually the result of a fault or system mismatch, particularly in a digital circuit. For example, many electronic components such as flip-flops are triggered by a pulse that must not be shorter than a specified minimum duration, otherwise the component may malfunction. In a circuit including flip-flops, a pulse shorter than the specified minimum is called a glitch. Similarly, a runt pulse whose amplitude is smaller than the minimum level specified for correct operation and a spike often caused by ringing or crosstalk are glitches that can cause operational faults such as misreading of bits, and the like.

In a digital-to-analog converter (DAC) that converts digital signals to analog form, a deglitching circuit may be included between the output of the DAC and subsequent circuitry to prevent switching transients, or glitches, from reaching the subsequent circuitry. In one typical arrangement, the DAC may exhibit high frequency voltage spikes in the output voltage occasioned by transients generated during the switching which takes place in the DAC. A deglitching circuit may be arranged to close one or more switches after the DAC has settled to charge a capacitor to the analog voltage. Just prior to the DAC changing its output, a timing control may open the switch(es) and maintain the switch(es) in an open condition until the new value provided by the DAC has settled at which time the switch is again closed so that the capacitor can be charged or discharged to a new potential. Typically, a deglitching circuit requires rapid switch operation.

Thus, it is with respect to these considerations and others that the present invention has been made.

BRIEF DESCRIPTION OF THE DRAWINGS

Non-limiting and non-exhaustive embodiments are described with reference to the following drawings.

DETAILED DESCRIPTION

Various embodiments will be described in detail with reference to the drawings. Reference to various embodiments does not limit the scope of the invention, which is limited only by the scope of the claims attached hereto. Additionally, any examples set forth in this specification are not intended to be limiting and merely set forth some of the many possible embodiments for the claimed subject matter.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other measurable quantity.

Briefly stated, embodiments are related to suppressing glitches in a digital input delay and deglitching circuit. Two switches are added to a delay and deglitch core comprising an RC filter and a Schmitt trigger. The switches, which may be implemented as complementary pairs of transistors driven by a pair of inverters, pull the input node of the Schmitt trigger high or low based on whether the input signal of the circuit and the output signal match or not. By returning the input node (where the RC filter is also coupled) to initial conditions after each glitch, multiple glitches such as ringing can be substantially reduced. Furthermore, a dependence of the RC-Schmitt trigger core delay time on a received glitch is also prevented enabling a delay time based on RC values only.

While a preferred embodiment of the present invention may be implemented in an off-chip serial communication circuit such as an Inter-Integrated Circuit (I2C) Bus communications circuit, the invention is not so limited. The described delay and deglitching circuit may be employed in any electronic device where digital signals with glitches are expected to be received.

Figure 1:
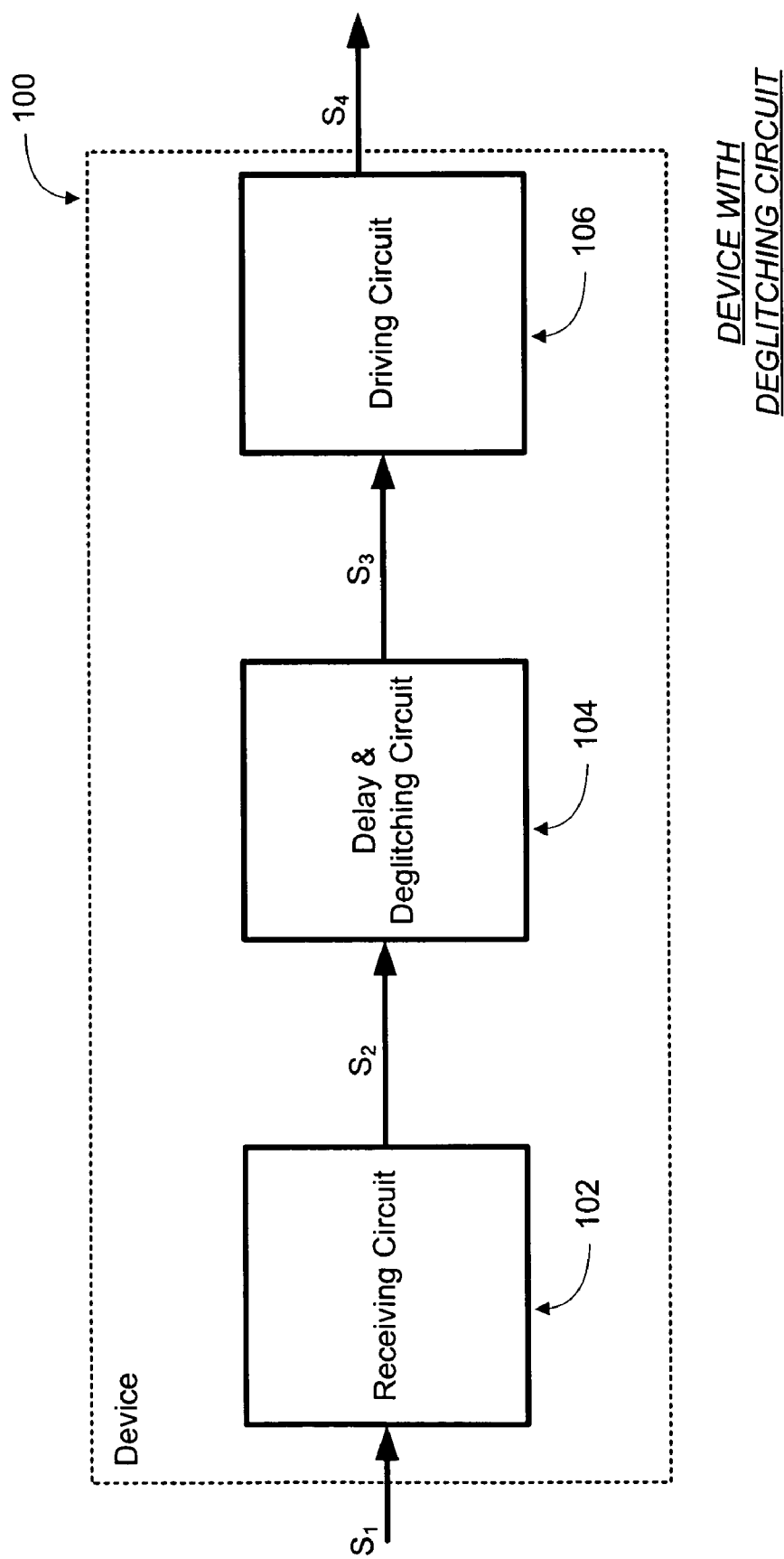
FIG. 1 illustrates a functional block diagram of a device with an input delay and deglitching circuit according to one embodiment.

FIG. 1 illustrates a functional block diagram of a device with an input delay and deglitching circuit according to one embodiment. Device 100 may be any electronic device receiving and processing digital signals. In a preferred embodiment, device 100 may be an I2C communications circuit with multiple subcircuits for distinct tasks. In a basic and exemplary embodiment, device 100 may include three main blocks: receiving circuit 102, delay and deglitching circuit 104, and driving circuit 106.

Receiving circuit 102 can be any circuit arranged to receive and in some cases to condition a signal. For example, receiving circuit 102 may include an amplifier, a filter, an analog to digital converter, and the like. In response to receiving input signal $S_1$, receiving circuit 102 provides signal $S_2$ to delay and deglitching circuit 104. $S_2$ may be a conditioned signal such as described above. Signal $S_2$ may include glitches due to ringing, interference, switching noise, and the like.

Delay and deglitching circuit 104 receives digital signal $S_2$, suppresses any glitches that may be included in the signal, and introduces a predetermined delay to the digital signal. Delays are introduced to received digital signals for many purposes including, but not limited to, adjusting internal clocks, synchronizing communications, and the like. As mentioned above, delay and deglitching circuit 104 suppresses pulses with a shorter duration than a period determined by the circuit components. According to one embodiment, the duration of suppressed glitches does not depend on a time between the glitches or a time between a last glitch and the signal transition (typically from low to high). According to another embodiment, a sensitivity of the suppressed glitch duration to supply voltage variation and circuit temperature may also be substantially reduced.

Delay and deglitching circuit 104 provides digital signal $S_3$ with glitches removed and appropriate delay introduced to driving circuit 106. Driving circuit 106 represents any sub-circuit within device 100 that consumes the delayed and deglitched signal. In some implementations, driving circuit 106 may amplify signal $S_3$ to a desired level (e.g. level-shift to rail-to-rail values of a particular circuit) and provide $S_4$ to be used by other circuits. In some cases, the other circuits may be off-chip.

The block diagram of device 100 described above is for illustration purposes only, and does not constitute a limitation on embodiments. The circuit may be implemented using fewer or additional blocks such as power supply circuits, filtering circuits, amplifying circuits, and the like, using the principles described herein. Furthermore, part or all of the circuits described above may be integrated. The delayed and deglitched signal may be provided to circuits within the same IC or in other parts of an electronic device.

Figure 2A:
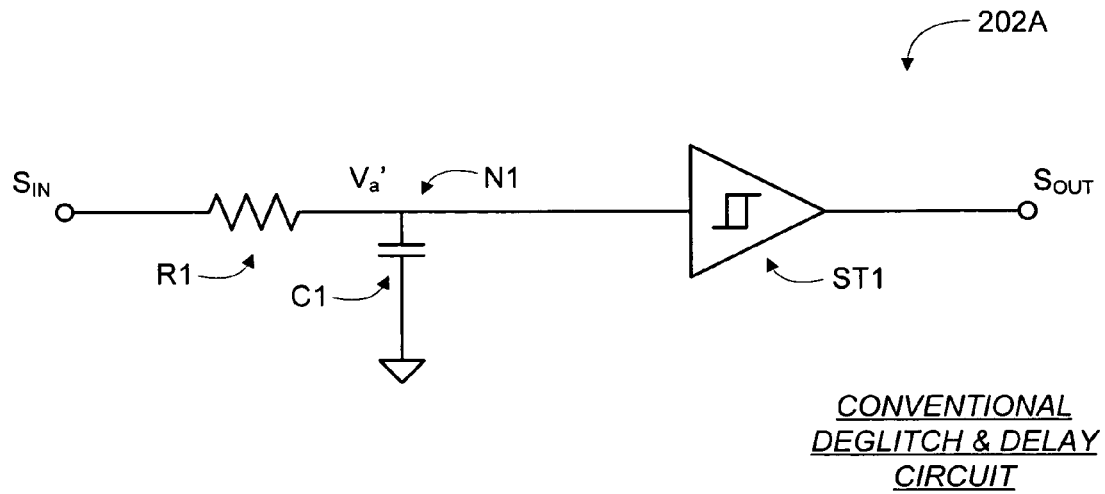
FIG. 2A schematically illustrates an example deglitching circuit.

FIG. 2A schematically illustrates an example deglitching circuit. Conventional delay and deglitching circuit 202A includes resistor R1 and capacitor C1 forming an RC filter, which receive input signal $S_{IN}$ and provide voltage $V_a'$ to an input of Schmitt trigger ST1. Schmitt trigger ST1 provides delayed and deglitched output signal $S_{OUT}$.

In a typical operation, a glitch in the input signal $S_{IN}$ is removed as capacitor C1 is being charged. Also, a delay is introduced as determined by the respective resistance and capacitance values of R1 and C1. However, in case of multiple glitches such as ringing, only the first one may be removed, while the subsequent ones are left in the signal. Furthermore, the introduced delay depends on a time between the last glitch and the input signal transition in the conventional circuit. Therefore, a shorter than desired delay may be introduced when multiple glitches are present.

Figure 2B:
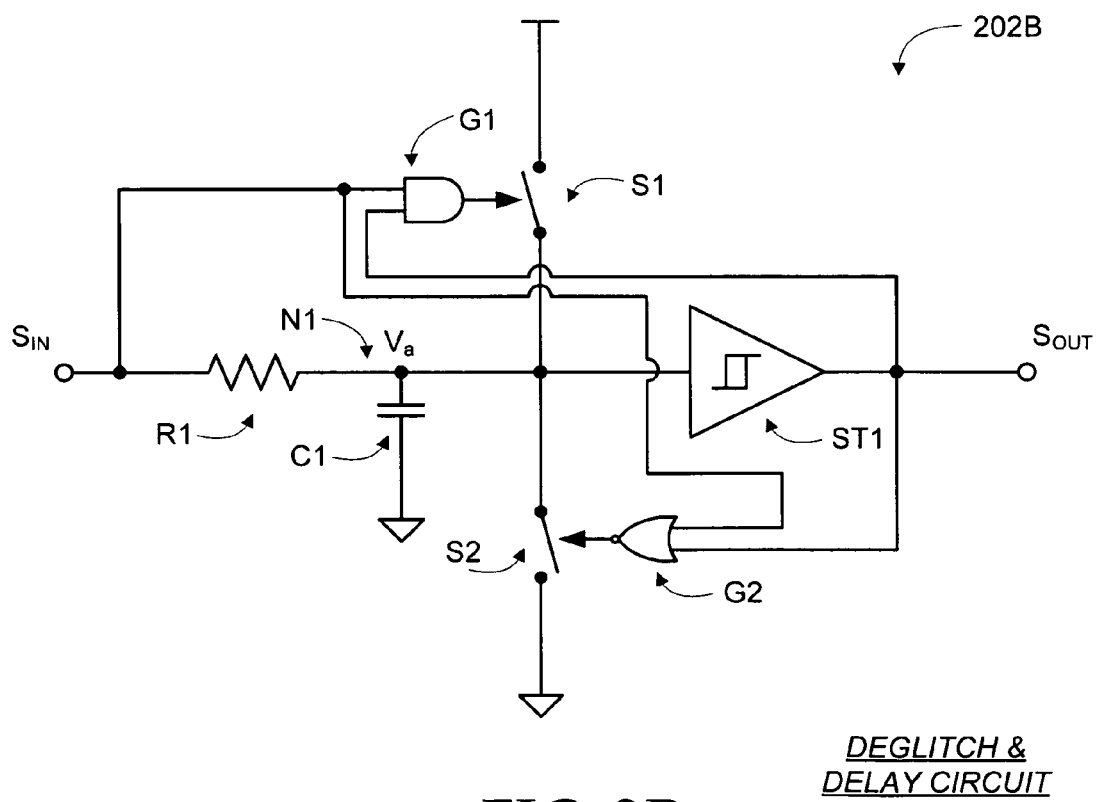
FIG. 2B schematically illustrates an embodiment of an input delay and glitch suppression circuit that may be used in the device of FIG. 1.

FIG. 2B schematically illustrates an embodiment of an input delay and glitch suppression circuit that may be used in the device of FIG. 1. Delay and deglitch circuit 202B includes switches S1 and S2 in addition to resistor R1, capacitor C1 and Schmitt trigger ST1 of the conventional circuit of FIG. 2A. Switches S1 and S2 are controlled by AND gate G1 and NOR gate G2, respectively.

In an operation, switches S1 and S2 are activated based on a comparison of the input and output signals pulling node N1 to high or low supply voltages (e.g. Vdd and Gnd) when ST1 makes a decision and input and output signals are substantially the same. By discharging capacitor C1 when the Schmitt trigger trips or a glitch is removed, node N1 is returned to initial conditions each time. Thus, more than one glitch can be removed with the same effectiveness. Furthermore, the introduced delay depends no longer on the time between the last glitch and the input signal transition, but on the resistance and capacitance values of R1 and C1 only. In serial data communications, unreliability of delay due to glitches can result in misread bits, and the like. Therefore, reliable removal of glitches along with consistent provision of delay to the signal is a significant feature.

Switches S1 and S2 represent components for resetting the conditions of node N1 based on feedback from the output signal and feeding forward from the input signal. Therefore, switches S1 and S2 may be implemented in a number of ways using the principles described herein. An example implementation is described below in the embodiment of FIG. 3. Moreover, AND gate G1 and NOR gate G2 represent a control mechanism of the switches based on the input and output signals. These two components can also be implemented in any way known in the art.

Figure 3:
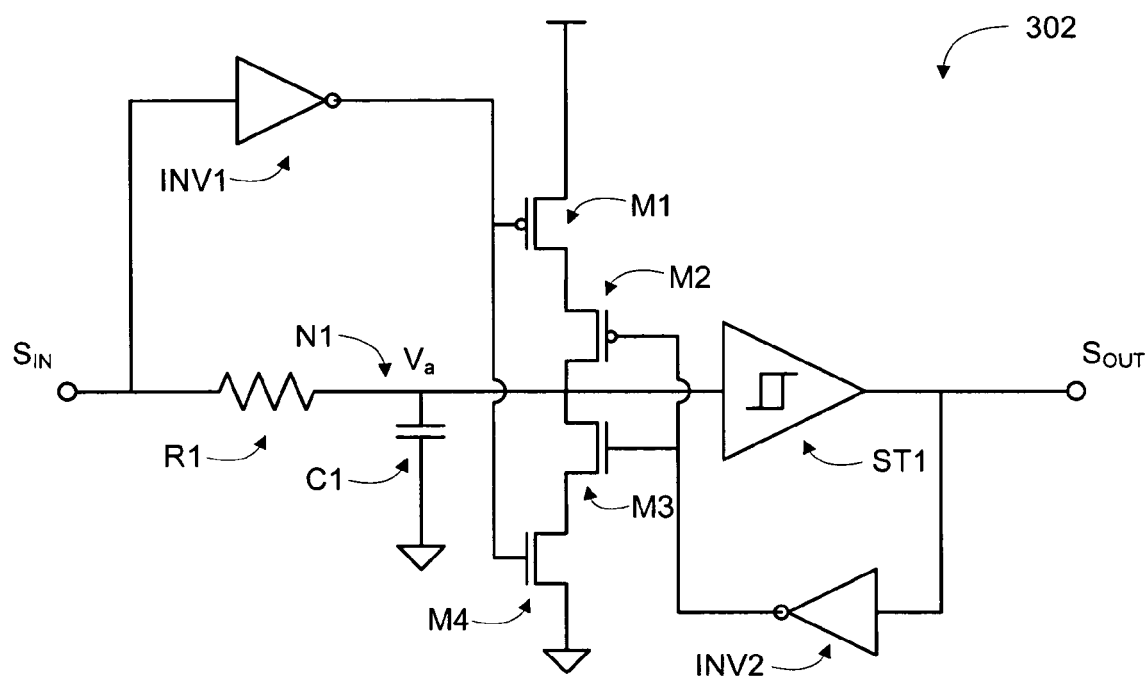
FIG. 3 schematically illustrates an example implementation of one embodiment of the delay and glitch suppression circuit of FIG. 2B.

FIG. 3 schematically illustrates an example implementation of one embodiment of the delay and glitch suppression circuit of FIG. 2B. The core elements of the delay and deglitch circuit are the same as in FIG. 2B: resistor R1 and capacitor C1 comprising an RC filter and Schmitt trigger ST1 coupled to the RC filter.

Circuit 302 additionally includes complementary transistor pairs M1-M2 and M3-M4. M1 and M2 serve as a switch for pulling node N1 to high supply voltage level (e.g. Vdd). M3 and M4 serve as another switch for pulling node N1 to low supply voltage level (e.g. Gnd). The transistor pairs are activated by inverters INV1 and INV2 feeding forward the input signal and feeding back the output signal, respectively.

In an operation, a glitch causes inverters INV1 and INV2 to turn on lower transistors M3 and M4 resetting node N1 to initial conditions (discharging C1) after the glitch. When the input signal transitions to high from low and the Schmitt trigger is tripped, both input and output signals are at high level causing INV1 and INV2 to turn on upper transistors M1 and M2. This results in node N1 being pulled up to high supply voltage level.

After the input signal ($S_{IN}$) transitions, voltage $V_a$ at node N1 can be expressed as:

$$V_a = V_{dd} * \left(1 - e^{\frac{1}{RC}}\right), \quad (1)$$

where Vdd is the high supply voltage, R a resistance of R1, and C a capacitance of C1. Schmitt trigger ST1 has typically a trip level at:

$$V_t = Vdd * \alpha, \quad (2)$$

where α varies between 0.5 and 0.75.

By setting the trip voltage $V_t$ equal to the voltage $V_a$ at node N1 and using equations (1) and (2), delay time $t_d$ can be evaluated as:

$$t_d = RC * \ln(1-\alpha). \quad (3)$$

Thus, if Schmitt trigger has negligible delay, a Vdd dependence of the delay time on Vdd is substantially reduced.

In some cases, a temperature dependence of R1 and C1 may cause a temperature-dependent variation of delay time $t_d$. By selecting R1 and C1 with mutually compensated temperature coefficients, the sensitivity of the circuit to temperature may also be substantially reduced resulting in a substantially constant and device parameter independent delay.

Embodiments of the present disclosure are not limited to the above described circuit. Other configurations with additional or fewer components may be implemented using the principles described herein. For example, the RC filter may be implemented in a number of ways and configurations. Additionally, the Schmitt trigger is a device designed to change the output rapidly in response to a change in the input. Other devices including, but not limited to, flip-flops, and the like may also be employed together with the delay portion of the circuit.

Furthermore, the switches may also be implemented in a number of ways known in the art. For example, the transistors of circuit 302 may be PMOS and NMOS type or other types.

Figure 4:
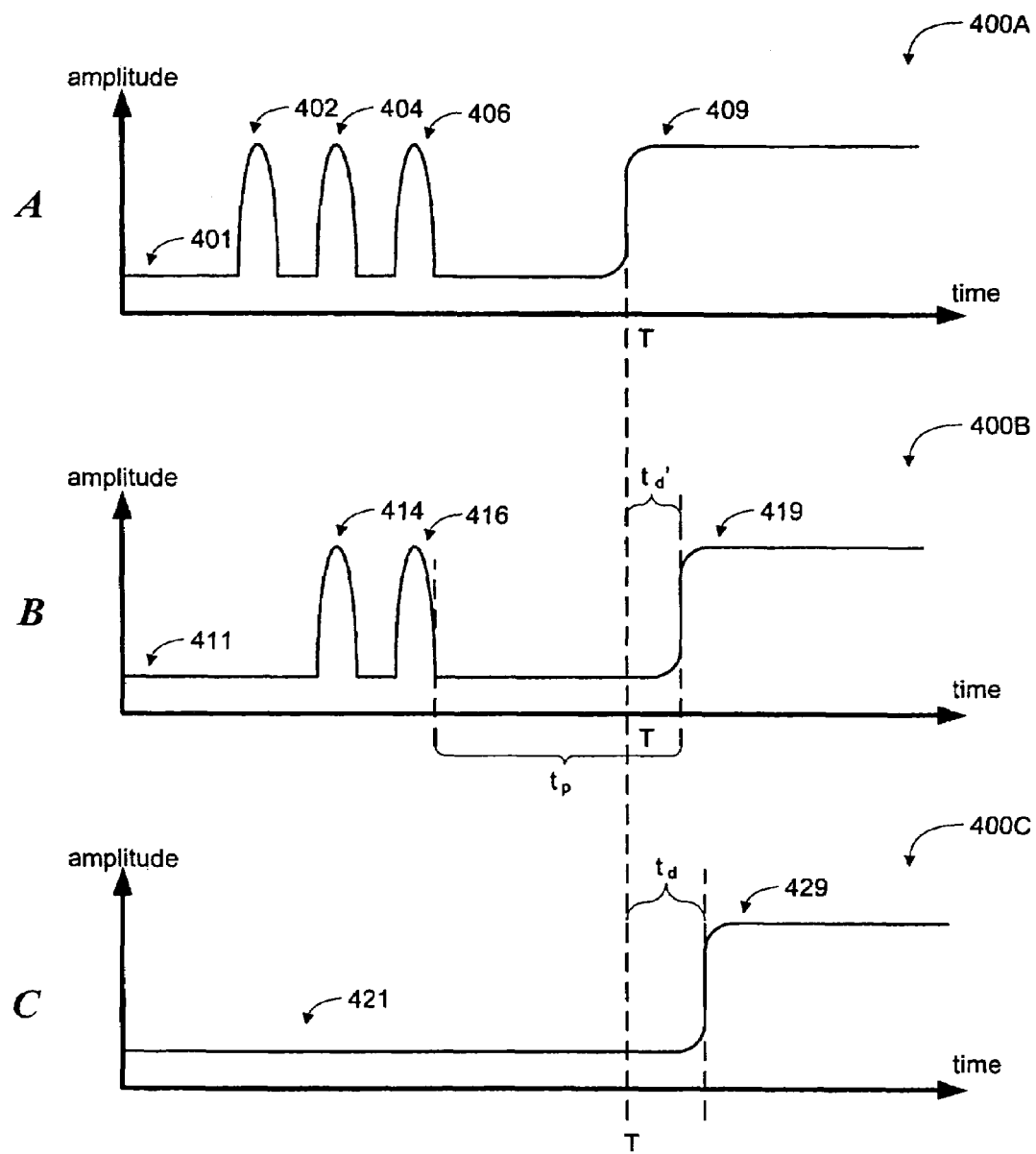
FIG. 4A illustrates a waveform of a digital input signal with glitches.
FIG. 4B illustrates the waveform of FIG. 4A after it has been processed through a delay and deglitching circuit such as the circuit of FIG. 2A.
FIG. 4C illustrates the waveform of FIG. 4A after it has been processed through a delay and deglitching circuit such as the circuit of FIG. 2B.

FIG. 4A illustrates a waveform of a digital input signal with glitches. Waveform 400A may be part of any digital signal such as one exchanged in a serial communications system. Waveform 400A is shown in a time diagram with horizontal axis representing time and vertical axis representing an amplitude of the signal.

Waveform 400A begins at a low level 401 (e.g. corresponding to bit "0"). Three glitches 402, 404, and 406 representing any number of glitches are shown superimposed onto waveform 400A at low level 401. At time point T, waveform 400A transitions to high level 409 (e.g. corresponding to bit "1"). It should be noted that in real operation waveform 400A would include numerous transitions. The number and place of the glitches along time axis may also be arbitrary. Waveform 400A is intended for illustration purposes.

FIG. 4B illustrates the waveform of FIG. 4A after it has been processed through a delay and deglitching circuit such as the circuit of FIG. 2A. As described previously, conventional deglitching circuit 202A removes successfully the first glitch by charging a capacitor. However, subsequent glitches (e.g. glitches 414 and 416) remain superimposed onto low level 411 of waveform 400B.

A delay of $t_d'$ is introduced in waveform 400B by the circuit 202A. In an ideal case, a constant delay is desired for consistency and reliability. However, the introduced delay in circuit 202A is dependent on a time between last glitch 416 and a transitioning time point of the signal to high level 419. In FIG. 4B, this time period is designated as $t_p$. Depending on when the last glitch is superimposed onto the signal, tp can vary thereby varying $t_d'$. As mentioned above, this can lead to reliability problems especially in serial communication circuits.

FIG. 4C illustrates the waveform of FIG. 4A after it has been processed through a delay and deglitching circuit such as the circuit of FIG. 2B. Similar to waveforms 400A and 400B, waveform 400C is also shown in a time diagram with the horizontal axis representing time and the vertical axis representing an amplitude of the signal.

Differently from waveform 400B, which is generated by the conventional circuit 202A, waveform 400B no longer has any glitches superimposed. Furthermore, a constant time delay $t_d$ is introduced to the signal resulting in the transition from low level 421 to high level 429 occurring $t_d$ after time point T of the original transition. The delay $t_d$ is only dependent on the values of the RC filter of circuit 202B in this case providing a reliable delay in addition to suppression of multiple glitches.

Embodiments additionally methods of operation. A method of operation may be generally defined as a group of steps or operations leading to a desired result, due to the nature of the elements in the steps and their sequence. The methods are usually advantageously implemented as a sequence of steps or operations for a processor or programmable device, such as the structures described above.

Performing the steps, instructions, or operations of the methods requires manipulation of physical quantities. Usually, though not necessarily, these quantities may be transferred, combined, compared, and otherwise manipulated or processed according to the steps or instructions. These quantities include, for example, electrical, magnetic, and electromagnetic charges or particles, states of matter, and in the more general case can include the states of any physical devices or elements. It is convenient at times, principally for reasons of common usage, to refer to information represented by the states of these quantities as signals, voltages, currents, bits, values, symbols, or the like. It should be borne in mind, however, that all of these and similar terms are associated with the appropriate physical quantities, and that these terms are merely convenient labels applied to these physical quantities, individually or in groups.

This detailed description is presented largely in terms of schematic diagrams, flowcharts, algorithms, and symbolic representations of operations. Indeed, such descriptions and representations are the type of convenient labels used by those skilled in programming and/or the data processing arts to effectively convey the substance of their work to others skilled in the art. A person skilled in the art of electronic circuits may use these descriptions to readily generate specific circuits, devices, and methods for implementing the embodiments.

As mentioned above, the claimed subject matter also includes methods. Some are methods of operation of a delay and glitch suppression circuit. These methods can be implemented in any number of ways, including the structures described in this document. One such way is by machine operations, of devices of the type described in this document. Another optional way is for one or more of the individual operations of the methods to be performed by distinct components or subcircuits of a circuit.

Methods are now described more particularly according to embodiments.

Figure 5:
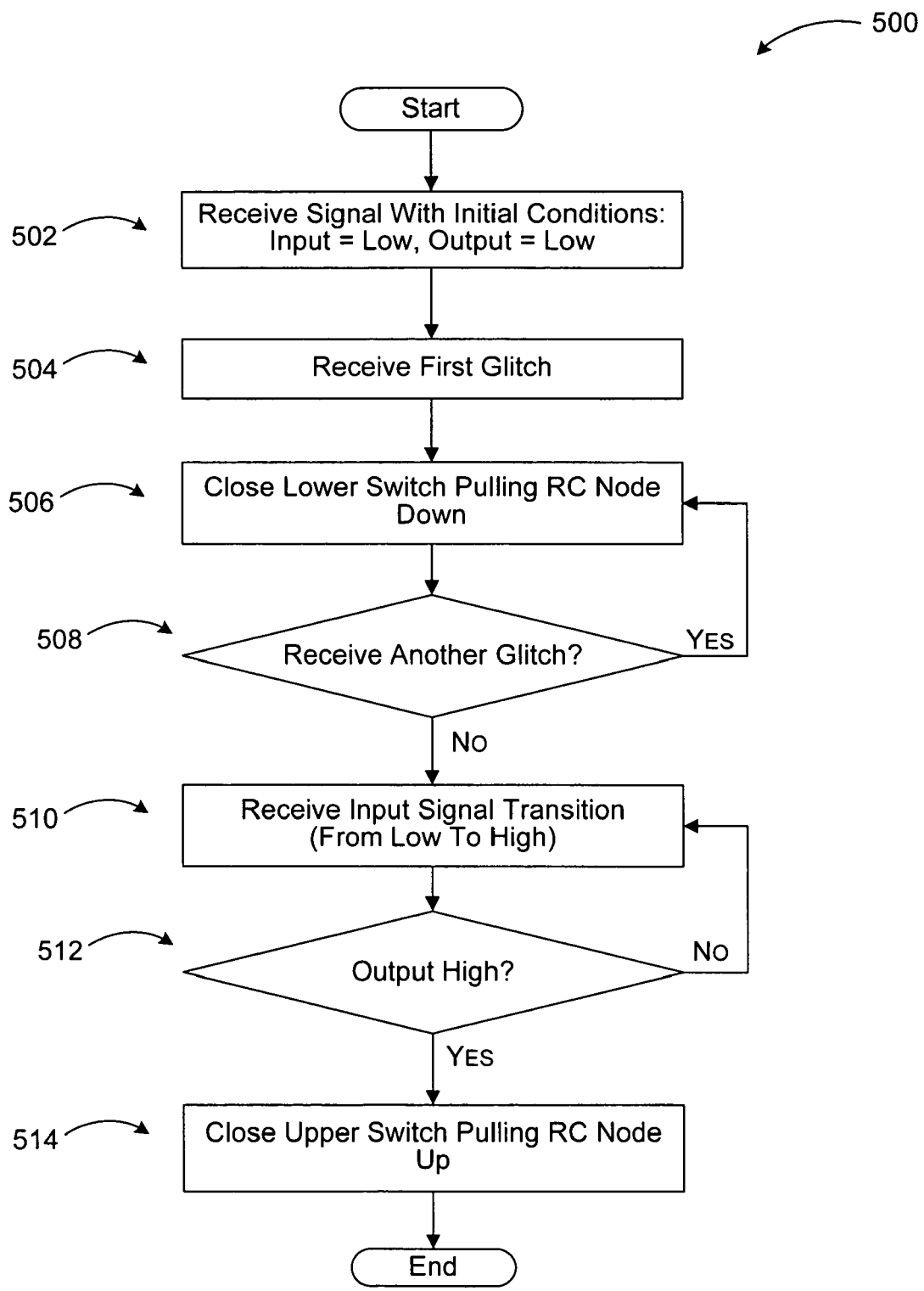
FIG. 5 is flow chart of a process for providing glitch suppression to a digital input signal according to an embodiment.

FIG. 5 is flow chart of a process for providing a delay and glitch suppression to a digital input signal according to an embodiment. The method of flowchart 500 may be implemented in a delay and deglitching circuit such as the delay and deglitching circuit 202B of FIG. 2B.

According to an operation 502, a digital signal is received with the initial conditions being input at a low level and the output being at the low level. In some cases, the input signal may not have a glitch. In such scenarios, the circuit may introduce the predetermined delay when the input signal transitions to a high level.

According to a next operation 504, the first glitch is received by the circuit. As explained previously, the capacitor of the RC filter of the circuit is charged slowly, but not to a level it would be charged when the signal transitions to a high level. Therefore, the glitch is removed from the signal.

According to a next operation 506, one of the two switches of the circuit is closed pulling the input node of the Schmitt trigger down to a low level. This resets the conditions at the RC filter to the initial conditions allowing the filter to remove a subsequent glitch.

According to a following decision operation 508, a determination is made whether another glitch is received. If another glitch is received, it is removed from the input signal by the filter, which has been reset to initial conditions. Then processing returns to operation 506, where the filter node is again reset for a further glitch that may be received. If no additional glitch is received, processing continues to operation 510.

According to operation 510, a transition of the input signal is received at the delay and deglitching circuit. The transition from low to high results in the filter capacitor being fully charged and tripping the Schmitt trigger after the delay determined by the values of the RC filter elements is introduced.

According to a next decision operation 512, a determination is made whether the output signal is also high matching the input signal. If the output signal has not changed yet, processing returns to operation 510 to wait until the output changes. If the output has changed, processing advances to operation 514.

At operation 514, the other of the two switches of the circuit is closed pulling the RC node up to the high supply voltage level. As a result of pulling the RC node up or down at the transition or after each glitch, the introduced delay is only dependent on the values of the RC filter resistor and capacitor, and multiple glitches can be removed. Furthermore, supply voltage variations' effect on the delay is substantially reduced.

In the above, the order of operations is not constrained to what is shown, and different orders may be possible. In addition, actions within each operation can be modified, deleted, or new ones added without departing from the scope and spirit of the claimed subject matter. Plus other, optional operations and actions can be implemented with these methods, as will be inferred from the earlier description.

In this description, numerous details have been set forth in order to provide a thorough understanding. In other instances, well-known features have not been described in detail in order to not obscure unnecessarily the description.

A person skilled in the art will be able to practice the embodiments in view of this description, which is to be taken as a whole. The specific embodiments as disclosed and illustrated herein are not to be considered in a limiting sense. Indeed, it should be readily apparent to those skilled in the art that what is described herein may be modified in numerous ways. Such ways can include equivalents to what is described herein.

The following claims define certain combinations and sub-combinations of elements, features, steps, and/or functions, which are regarded as novel and non-obvious. Additional claims for other combinations and sub-combinations may be presented in this or a related document.

What is claimed is:

1. A circuit for deglitching and delaying a digital signal, comprising:
    a slow-charge circuit configured to receive the digital signal and provide a first signal at a first node in response to a transition in the digital signal, wherein the digital signal includes at least one glitch;
    a fast comparator circuit coupled to the slow-charge circuit at the first node, wherein the fast comparator circuit is configured to transition an output signal in response to the first signal reaching a predetermined threshold;
    a first switch coupled to the first node, wherein the first switch is configured to reset the first signal to an initial value after each glitch in the digital signal, wherein the first switch includes a first pair of serially coupled transistors configured to provide the high supply voltage to the first node, a first inverter coupled between an input node and a gate of one of the first pair of transistors, and a second inverter coupled between an output node and a gate of another of the first pair of transistors; and
    a second switch coupled to the first node, wherein the second switch is configured to set the first signal to a high supply voltage value when the output signal and the digital signal are both at a high level.

2. The circuit of claim 1, wherein the second switch includes a second pair of serially coupled transistors configured to provide a low supply voltage to the first node, and wherein the first inverter is coupled between the input node and a gate of one of the second pair of transistors and the second inverter is coupled between the output node and a gate of another of the second pair of transistors.

3. The circuit of claim 2, wherein the first pair of transistors is PMOS and the second pair of transistors is NMOS.

4. The circuit of claim 2, wherein the low supply voltage is a ground voltage.

5. The circuit of claim 1, wherein the digital signal is a serial communication signal.

6. The circuit of claim 1, wherein the fast comparator circuit is a Schmitt trigger.

7. The circuit of claim 1, wherein the slow-charge circuit is an RC filter comprising a resistor circuit and a capacitor circuit coupled at the first node.

8. The circuit of claim 7, wherein the resistor circuit and the capacitor circuit are selected to have mutually compensating temperature coefficients.

9. A method for deglitching and delaying a digital signal, comprising:
    increasing a voltage at a first node in response to a transition of the digital signal to a high level such that a glitch in the digital signal is insufficient to increase the voltage to a predetermined threshold;
    transitioning an output signal to the high level in response to the voltage at the first node reaching the predetermined threshold;
    resetting the voltage at the first node to an initial value after a glitch is encountered in the digital signal; and
    setting the voltage at the first node to a high supply voltage value when the output signal and the digital signal are both at the high level, wherein setting the voltage at the first node to the high supply voltage comprises closing a switch between the first node and a high supply voltage node in response to the digital signal and the output signal both having a high value, the switch including a first pair of serially coupled transistors configured to provide the high supply voltage to the first node, a first inverter coupled between an input node and a gate of one of the first pair of transistors, and a second inverter coupled between an output node and a gate of another of the first pair of transistors.

10. The method of claim 9, further comprising:
    resetting the voltage at the first node to the initial value only when the output signal and the digital signal are both at a low level.

11. The method of claim 9, wherein the initial value is a low supply voltage value.

12. The method of claim 9, wherein resetting the voltage at the first node comprises coupling the first node to a low supply voltage node.

13. The method of claim 9, wherein increasing the voltage at the first node in response to the transition of the digital signal comprises charging a capacitor circuit through a resistor circuit.

14. The method of claim 13, wherein resetting the voltage at the first node includes discharging the capacitor circuit.

15. The method of claim 13, further comprising:
    selecting the resistor circuit and the capacitor circuit to have mutually compensating temperature coefficients such that a delay introduced to the digital signal by the resistor circuit and the capacitor circuit is substantially independent of a circuit temperature.

16. The method of claim 9, wherein transitioning the output signal to the high level in response to the voltage at the first node includes performing a fast comparison of the voltage at the first node and the predetermined threshold.

* * * * *